US011402157B2

(12) United States Patent
Wang et al.

(10) Patent No.: US 11,402,157 B2
(45) **Date of Patent: *Aug. 2, 2022**

(54) LATTICE BOILER EVAPORATOR

(71) Applicant: Acer Incorporated, New Taipei (TW)

(72) Inventors: Yung-Chih Wang, New Taipei (TW); Cheng-Wen Hsieh, New Taipei (TW); Wen-Neng Liao, New Taipei (TW); Jau-Han Ke, New Taipei (TW)

(73) Assignee: ACER INCORPORATED, New Taipei (TW)

( * ) Notice: Subject to any disclaimer, the term of this patent is extended or adjusted under 35 U.S.C. 154(b) by 213 days.

This patent is subject to a terminal disclaimer.

(21) Appl. No.: 16/721,988

(22) Filed: Dec. 20, 2019

(65) Prior Publication Data

US 2020/0124351 A1 Apr. 23, 2020

Related U.S. Application Data

(62) Division of application No. 15/451,564, filed on Mar. 7, 2017, now Pat. No. 10,563,926.

(30) Foreign Application Priority Data

Sep. 2, 2016 (TW) ................................ 105128432

(51) Int. Cl.
*F28D 15/02* (2006.01)
*F28D 1/03* (2006.01)
(Continued)

(52) U.S. Cl.
CPC ........... *F28D 15/025* (2013.01); *B21D 53/06* (2013.01); *B23P 15/26* (2013.01); *F28D 1/0358* (2013.01);
(Continued)

(58) Field of Classification Search
CPC ......... Y10T 29/49396; Y10T 29/49364; Y10T 29/49393; Y10T 29/4935; F28D 1/0226;
(Continued)

(56) References Cited

U.S. PATENT DOCUMENTS 4,009,752 A * 3/1977 Wilson ................ H01L 23/3672 165/81
6,648,062 B2 11/2003 Fukazu et al.
(Continued)

FOREIGN PATENT DOCUMENTS

| | | | |
|---|---|---|---|
| CN | 201115234 | Y | 9/2008 |
| TW | 201040480 | A | 11/2010 |
| TW | M535456 | U | 1/2017 |

OTHER PUBLICATIONS

Taiwan Office Action, dated Mar. 23, 2018, 9 pages.
(Continued)

*Primary Examiner* — Matthew P Travers
(74) *Attorney, Agent, or Firm* — Edell, Shapiro & Finnan, LLC

(57) ABSTRACT

An evaporator suitable for a thermal dissipation module. The thermal dissipation module includes a tube or pipe and fluid. The evaporator includes a housing, a first heat dissipation structure and a second heat dissipation structure disposed in a sealed chamber of the housing. The chamber is configured to communicate with the pipe, and the fluid is configured to flow in the pipe and the chamber. The first heat dissipation structure and a second heat dissipation structure provide a plurality of fluid flow passages through which the fluid flows and evaporates. A manufacturing method of the evaporator is also disclosed.

6 Claims, 4 Drawing Sheets

(51) Int. Cl.
*B21D 53/06* (2006.01)
*B23P 15/26* (2006.01)
*B23K 101/14* (2006.01)
*H01L 23/427* (2006.01)

(52) U.S. Cl.
CPC ........ *F28D 15/0266* (2013.01); *H01L 23/427* (2013.01); *B23K 2101/14* (2018.08)

(58) Field of Classification Search
CPC .... F28D 15/025; F28D 1/0246; F28D 1/0316; F28D 1/0358; F28D 5/00; F28D 15/0266; F28F 1/045; B21D 53/022; B21D 53/02; B21D 53/04; B21D 53/06; B23K 2101/14; B23P 15/26; B23P 2700/10; H01L 23/473
See application file for complete search history.

(56) References Cited

U.S. PATENT DOCUMENTS 6,842,342 B1 * 1/2005 Lin .......................... F28F 3/02 165/80.3
7,140,423 B2 * 11/2006 Chang ................. F28D 15/0266 165/104.33
7,203,064 B2 4/2007 Mongia et al.
7,215,545 B1 5/2007 Moghaddam et al.
7,370,692 B2 * 5/2008 Wei ..................... H01L 23/3672 165/185
7,775,262 B2 8/2010 Liu et al.
7,876,563 B2 1/2011 Shiba
8,081,465 B2 12/2011 Nishiura
8,553,415 B2 * 10/2013 Wang ...................... G06F 1/203 361/697
9,171,776 B2 10/2015 Miyazawa
9,441,888 B2 9/2016 Chang et al.
9,472,488 B2 10/2016 Gohara
9,516,791 B2 12/2016 Chester et al.
9,835,382 B2 12/2017 Wang et al.
9,960,100 B2 5/2018 Arai et al.
10,058,010 B2 8/2018 Totani et al.
10,136,550 B2 11/2018 Chainer et al.
2004/0200609 A1 * 10/2004 Chen ................... H01L 23/3672 165/185
2005/0082158 A1 4/2005 Wenger
2005/0259398 A1 * 11/2005 Liu ..................... H01L 23/3672 361/703
2006/0037735 A1 2/2006 Connors
2007/0006994 A1 1/2007 Liu et al.
2008/0029260 A1 * 2/2008 Hu ............................ F28F 3/12 165/182
2008/0302506 A1 * 12/2008 Luo ..................... H01L 21/4882 165/80.3
2009/0065178 A1 3/2009 Kasezawa et al.
2009/0183863 A1 * 7/2009 Shu ..................... H01L 23/3672 165/78
2010/0018669 A1 1/2010 Chen
2010/0238629 A1 9/2010 Shiba
2011/0192574 A1 8/2011 Yoshikawa et al.
2012/0024499 A1 2/2012 Chang et al.
2012/0033382 A1 2/2012 Tsunoda et al.
2012/0097382 A1 * 4/2012 Chen ....................... F28F 19/00 165/185
2012/0312509 A1 12/2012 Yuan et al.
2013/0206369 A1 8/2013 Lin et al.
2013/0240195 A1 9/2013 Chen
2014/0331709 A1 11/2014 Chiba et al.
2015/0021756 A1 * 1/2015 Adachi ............... H01L 23/3672 257/714
2015/0181764 A1 6/2015 Honmura et al.
2015/0189791 A1 7/2015 Tamura
2016/0379914 A1 12/2016 Arai et al.
2017/0020032 A1 1/2017 Wang et al.
2017/0025326 A1 * 1/2017 Koyama ............. H01L 23/3675
2017/0074595 A1 3/2017 Wang et al.
2017/0074596 A1 3/2017 Wang et al.
2017/0125323 A1 5/2017 Sakamoto et al.
2017/0271240 A1 * 9/2017 Inoue ...................... H01L 25/18
2017/0293329 A1 10/2017 Chiriac et al.
2018/0031328 A1 2/2018 Cheng et al.
2018/0066895 A1 3/2018 Wang et al.

OTHER PUBLICATIONS

Taiwan Search Report, dated Mar. 21, 2018, 1 pages.
European Search Report, EP17175586, dated Nov. 30, 2017, 7 pages.

* cited by examiner

LATTICE BOILER EVAPORATOR

TECHNICAL FIELD

Embodiments of the present invention are directed to heat management in an electronic device.

BACKGROUND

Electronic portable devices such as laptops, tablet personal computers (PCs), smart phones and other products are increasingly used in daily life. Some of the electronic components employed by these electronic devices generate thermal energy (heat) during operation, which, in order for the device to operate properly, must be dissipated. In this regard, a cooling module or a heat sink, in the form of, e.g., a cooling fan, a heat pipe, or a two-phase siphon cooling system (or two-phase thermosiphon cooling system) may be incorporated inside the electronic device to assist in dissipating excess heat.

The heat dissipation efficiency of a heat conductive sheet or heat pipe is limited, however, so a cooling fan is often employed in combination therewith. However, the operation of a cooling fan relies on power provided by a battery of the electronic device, leading to increased consumption of that limited battery power. While some electronic devices have been designed with a two-phase siphon cooling system, such a system typically requires a fluid to circulate in a pipeline as a result of a difference of potential energy (height) and the gravitational force among the fluid molecules. When the relative state between the electronic device and the gravitational direction changes, the efficiency of such a cooling system decreases.

SUMMARY

The present invention provides an evaporator which can improve the circulation efficiency of the fluid in a heat dissipation module.

The present invention further provides a method of manufacturing an evaporator that can improve product yield and reduce manufacturing costs.

The evaporator of the present invention is suitable for use in a heat dissipation module in which the heat dissipation module comprises a tube and a fluid. The evaporator includes a housing and a first heat dissipation structure. The housing has a chamber for communicating with the tube, and the fluid is configured to flow in the tube and chamber. A first heat dissipation structure is provided in the chamber, wherein the first heat dissipation structure has a plurality of first flow passages and is adapted to cause fluid to flow through the first flow passages when the fluid flows in the chamber.

The method of manufacturing the evaporator of the present invention includes the following steps. A first heat dissipation structure is formed, wherein the first heat dissipation structure has a plurality of first flow paths. A housing is formed, wherein the housing has a chamber, a first opening and a second opening. The first heat dissipation structure is disposed in the chamber such that the chamber is adapted to allow fluid to flow between the first and second openings via the first flow passages.

Based on the above, the evaporator of the present invention is provided with a first heat dissipation structure in the chamber of the housing, and the first heat dissipation structure has a plurality of first flow passages for passage of the fluid. This arrangement helps to increase the contact area between the fluid and the housing to increase the rate of vaporization of the fluid after the housing has received heat from the electronic component or heat pipe. The fluid in the circuit formed by the tube and chamber undertakes a change of state in the chamber (i.e., the fluid evaporates), resulting in a cooling effect.

Notably, the first heat dissipation structure is assembled into the housing after fabrication. This is in contrast to prior art methods of evaporator fabrication, wherein such an evaporator structure is etched or formed by computer numerical control (CNC) tools. Thus, the method for producing the evaporator of the invention not only improves product yield but also reduces production cost.

BRIEF DESCRIPTION OF THE DRAWINGS

Embodiments are described herein in conjunction with the accompanying drawings, in which.

DESCRIPTION OF EXAMPLE EMBODIMENTS

Figure 1:
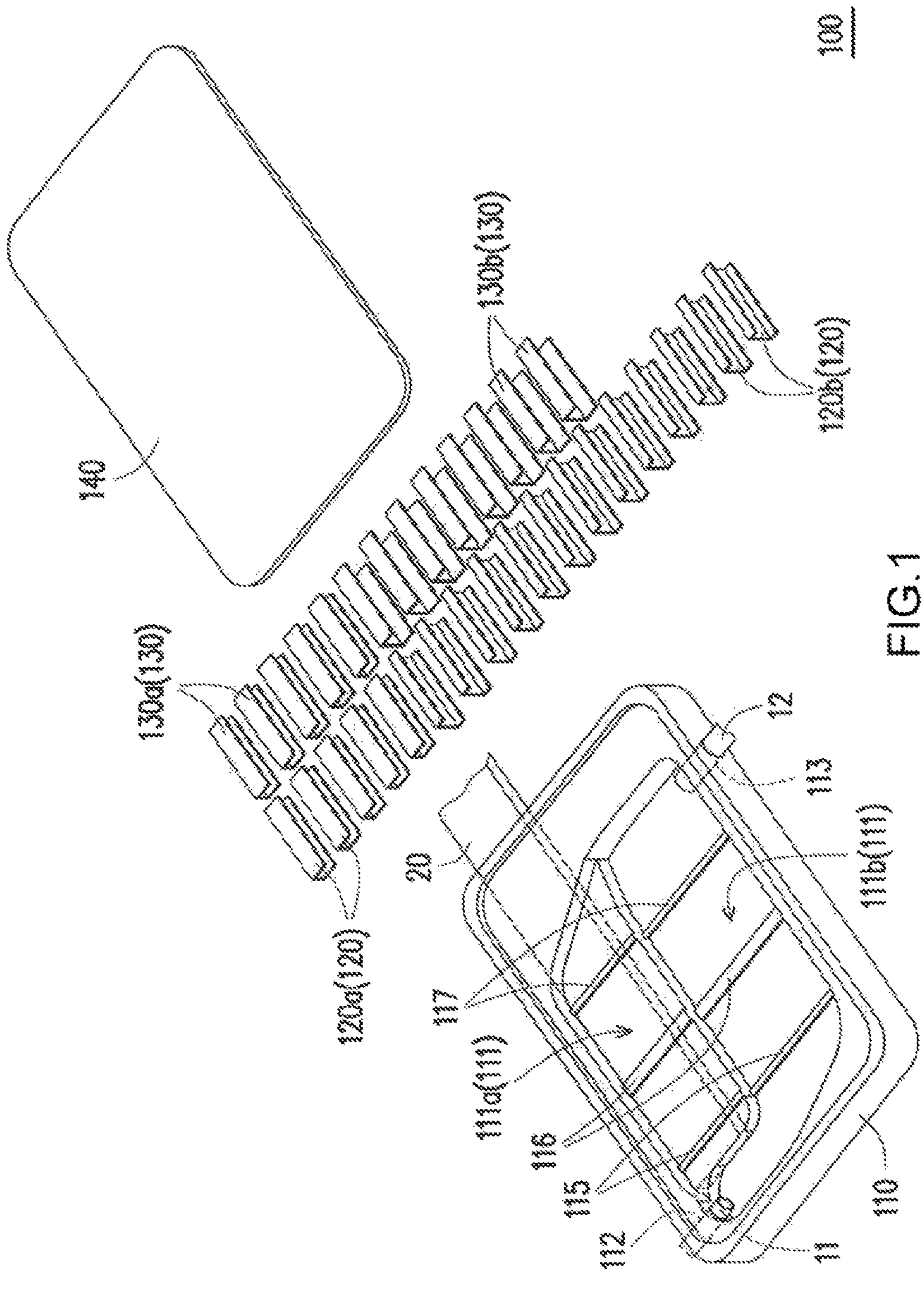
FIG. 1 is an exploded schematic view of an evaporator according to an embodiment of the present invention.
Figure 2:
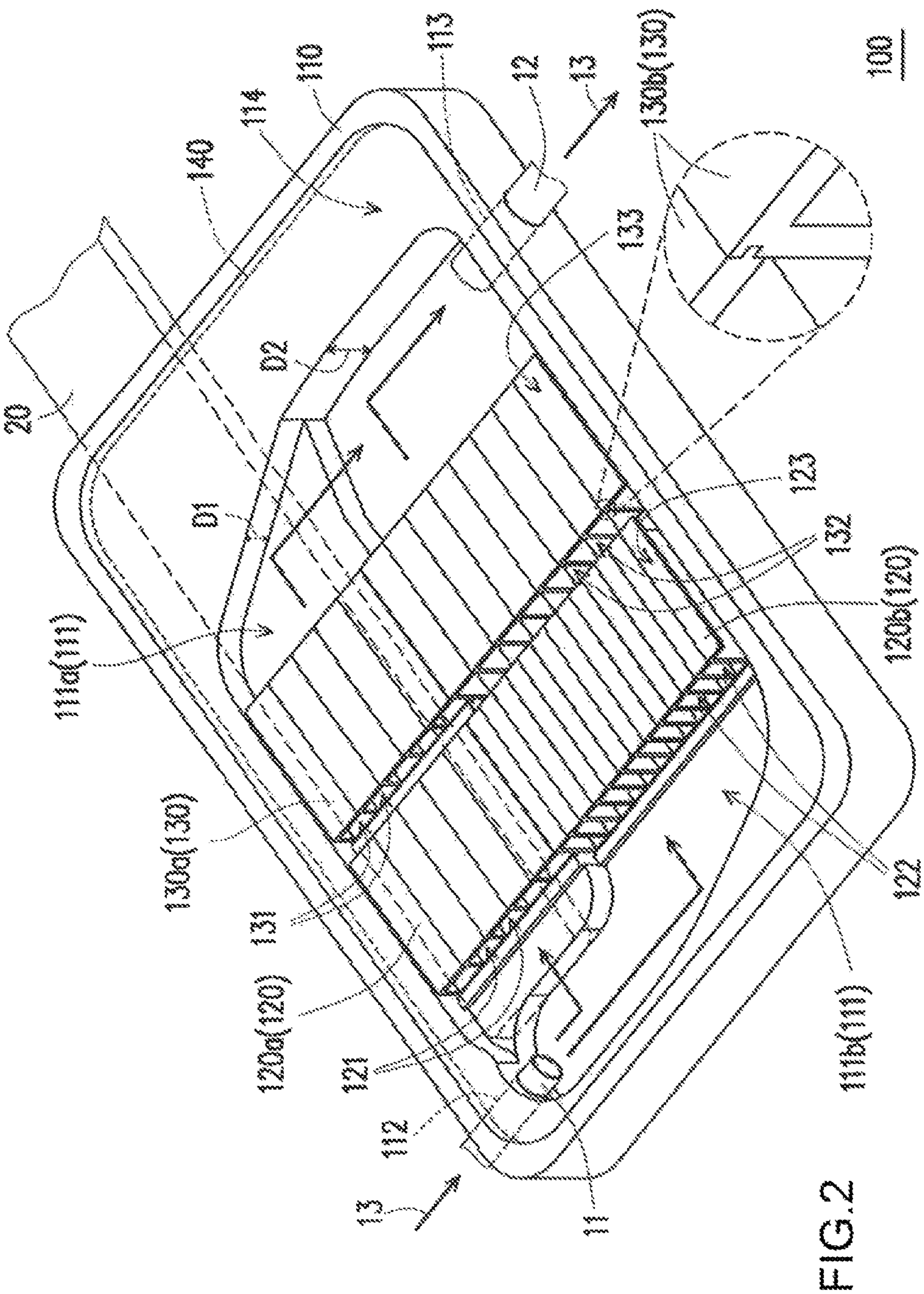
FIG. 2 is a schematic structural view of the evaporator and a heat dissipation module of FIG. 1 according to an embodiment of the present invention.
Figure 3:
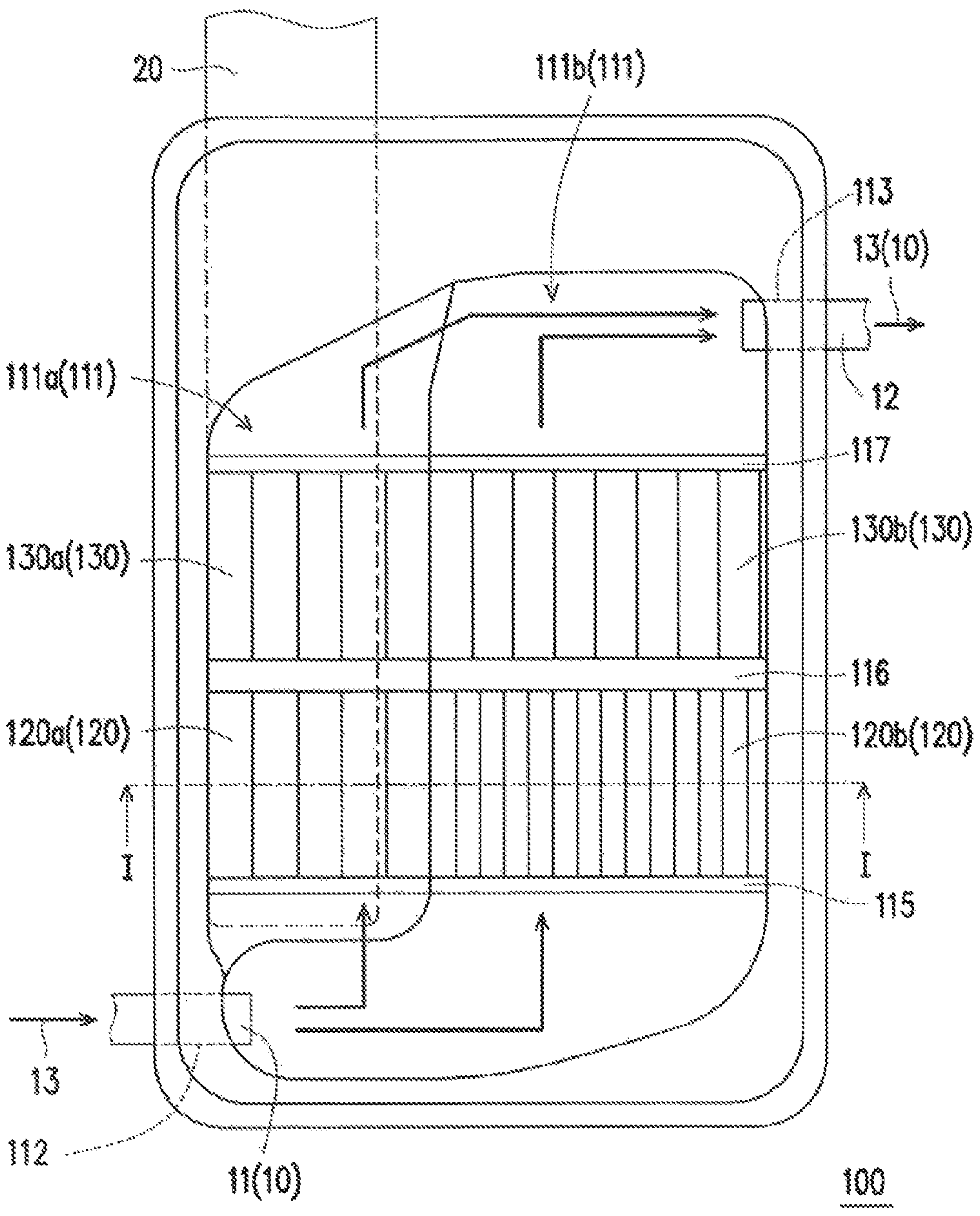
FIG. 3 is a top view of the evaporator and heat dissipation module of FIG. 2 according to an embodiment of the present invention.
Figure 4:
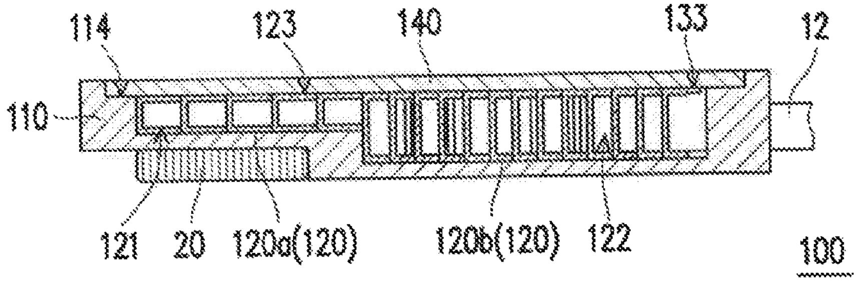
FIG. 4 is a cross-sectional view of FIG. 3 taken along line I-I according to an embodiment of the present invention.

FIG. 1 is an exploded schematic view of an evaporator 100 according to an embodiment of the present invention. FIG. 2 is a schematic structural view of the evaporator 100 and the heat dissipation module of FIG. 1. FIG. 3 is a schematic top view of the evaporator and heat sink module of FIG. 2. FIG. 4 is a schematic cross-sectional view of FIG. 3 taken along line I-I. For clarity and ease of illustration, a lid 140 of FIGS. 2 and 3 is depicted transparently. In FIGS. 1 to 4, in the present embodiment, the evaporator 100 may be integrated into or be part of an overall heat dissipation module (including, e.g., a heat pipe 20) and provided in an electronic apparatus (not shown). The electronic device (not shown) may be a smart phone, tablet, notebook, docking station or other electronic product with an internal electronic component (not shown) such as a central processing unit or a display chip. The heat sink module may be thermally coupled to an electronic component (not shown) to absorb heat generated by the electronic component. In this way, the evaporator 100 dissipates the heat generated by the electronic component that has been transferred via the heat pipe 20.

The evaporator 100 and the heat dissipation module may constitute a siphonic heat dissipation assembly, wherein the heat dissipation module includes a first tube element or pipe 11, a second tube element or pipe 12 and a fluid 13 (see, e.g., FIGS. 2 and 3, the flow of which is denoted by arrows. First tube element or pipe 11 and second tube element or pipe 12 are respectively communicated with the evaporator 100, and the fluid 13 is configured to flow in the first pipe 11, the second pipe 12, and the evaporator 100. The evaporator 100 may include a housing 110 having a chamber 111, a first opening 112, and a second opening 113 with respect to the first opening 112, a first heat dissipation structure 120, a second heat dissipation structure 130, and a cover or lid 140. The first opening 112 and the second opening 113 are communicated with the chamber 111, respectively. The first pipe 11 is disposed in the first opening 112 and communicates with the chamber 111. The second pipe 12 is disposed in the second opening 113. As such, the fluid 13 may flow into the chamber 111 via the first pipe 11 and out of the chamber 111 via the second pipe 12. The end of the second pipe 12 may be directly connected to the first pipe 11, i.e., end portions of the same tubular member function as the first pipe 11 and the second pipe 12, respectively, or the end of the first pipe 11 may be indirectly connected to the end of the second pipe via a condenser (not shown). The first pipe 11 is connected to allow the fluid 13 to flow from the second pipe 12 out of the chamber 111 and continue to flow to the first pipe 11 and back into the chamber 111. In other words, the first pipe 11, the second pipe 12, and the chamber 111 may constitute a circuit for circulating a flow of the fluid 13.

In the present embodiment, the chamber 111 may be divided into a first evaporation zone 111*a* and a second evaporation zone 111*b*. The first evaporation zone 111*a* and the second evaporation zone 111*b* may be thermally coupled to the housing 110 through the heat pipe 20. In the embodiment shown, the heat pipe 20 is located directly under the first evaporation zone 111*a*. The heat of the heat pipe 20 can thus be conducted into the chamber 111 via the housing 110. After the fluid 13 flows into the chamber 111 through the first pipe 11, the fluid 13 flows through the first evaporation zone 111*a* and the second evaporation zone 111*b*, respectively, and absorbs heat. The phase of the fluid 13, in liquid form, may be converted to gaseous fluid 13 (evaporation) and heat is thus removed as gaseous fluid 13 flows out of chamber 111 via the second pipe 12. Thereafter, the fluid 13, in a gaseous state, can be re-condensed as the second pipe 12 and the first pipe 11 pass through lower temperature portions of the electronic device (not shown), such that the heat is dissipated to the outside world. Fluid 13, which has been converted from the gaseous state back to the liquid state, may then be returned to the chamber 111 via the first pipe 11.

The first heat dissipation structure 120 and the second heat dissipation structure 130 are juxtaposed in the chamber 111, viewed from the first opening 112 toward the second opening 113, and the second heat dissipation structure 130 is arranged rearward of the first heat dissipation structure 120, as shown in FIG. 2. The first heat dissipation structure 120 and the second heat dissipation structure 130 may be fixed to the housing 110 by welding, for example, by using a solder paste or other solder between the first and second heat dissipation structures 120, 130 and the housing 110. The first and second heat dissipation structures 120 and 130 are respectively heated by the housing 110 and the first heat dissipation structure 120 and the second heat dissipation structure 130 are welded to the chamber 110.

In other embodiments, however, a heat-conducting medium such as a thermally conductive paste may be used between the first and second heat dissipating structures 120, 130 and the housing 110, or the first and second heat dissipating structures 120, 130 may be simply brought into contact with the housing 110 without welding. The cover or lid 140 is disposed on the housing 110 and covers the chamber 111 and the first and second heat dissipation structures 120, 130 disposed in the chamber 111 so that the chamber 111 is sealed to the outside. That is, once the cover 140 covers the chamber 111, the chamber 111 constitutes a closed space with the only ingress and egress via the first pipe 11 and the second pipe 12, respectively.

Preferably, the engagement of the cover 140 with the housing 110 may be provided with a leak-proof structure to prevent leakage of the fluid 13 from the chamber 111. In this regard, the cover 140 may be welded to the housing 110 to seal the chamber 111. More specifically, the housing 110 includes a bearing surface 114 on which cover 140 may be disposed. The bearing surface 114 substantially conforms to, i.e., is at the same height as, a first upper surface 123 of the first heat dissipation structure 120 and a second upper surface 133 of the second heat dissipation structure 130 such that the cover 140 abuts against the bearing surface 114, the first upper surface 123 and the second upper surface 133. Thus, the first heat dissipation structure 120 and the second heat dissipation structure 130 also support the cover 140.

As shown in the figures, the first heat dissipation structure 120 is located between the first opening 112 and the second heat dissipation structure 130, and the second heat dissipation structure 130 is located between the first heat dissipation structure 120 and the second opening 113. The first heat dissipation structure 120 spans a first evaporation zone 111*a* and a second evaporation zone 111*b* and has a plurality of first flow passages 121 and 122, and similarly, the second heat dissipation structure 130 spans the first evaporation zone 111*a* and the second evaporation zone 111*b*, and has a plurality of second flow paths 131 and 132. Accordingly, the fluid 13 flowing from the first opening 112 into the chamber 111 first passes through the first flow passages 121 and 122, passes through the second flow passages 131 and 132, and finally flows out of the chamber 111 via the second opening 113.

The first heat dissipation structure 120 may be constituted by a plurality of first structural members 120*a* and 120*b* interconnected with one another. The first flow passages 121 may be defined by the interconnected first structural members 120*a*, and the first flow passages 122 may be defined by the interconnected first structural members 120*b*. In the embodiment shown, a depth D1 of the first evaporation zone 111*a* is less than a depth D2 of the second evaporation zone 111*b*. The first structural members 120*a* are disposed in the first evaporation zone 111*a* and the height of the first structural members 120*a* is substantially equal to depth D1. The first structural members 120*b* are disposed within the second evaporation zone 111*b* and the height of the first structural members 120*b* is substantially equal to the depth D2. The number of the first structural members 120*b* is, for example, larger than the number of the first structural members 120*a*, and the first structural members 120*a* and 120*b* may have two different sizes, respectively. As such, the first flow passages 121 located in the first evaporation zone 111*a* have a different cross-sectional area compared to the first flow passages 122 located in the second evaporation zone 111*b*, and the number of the first flow passages 121 is smaller than the number of the first flow passages 122.

The second heat dissipation structure 130 may be constituted by a plurality of second structural members 130*a* and 130*b*, and the second flow passages 131 may be defined by the interconnected second structural members 130*a*. The second flow passages 132 are defined by the second structural members 130*b*. In the embodiment shown, the second structural members 130*a* are disposed in the first evaporation zone 111*a* and the height of the second structural members 130*a* is substantially equal to the depth D1. The second structural members 130*b* are disposed in the second evaporation zone 111*b* and the height of the second structural members 130*b* is substantially equal to the depth D2. The number of the second structural members 130*b* is, for example, larger than the number of the second structural members 130*a* such that the second structural members 130*a* and 130*b* have two different sizes, respectively. As such, the second flow passage 131 in the first evaporation zone 111*a* have a different cross-sectional area compared to the second flow passages 132 in the second evaporation zone 111*b*, and the number of the second flow passages 131 is smaller than the number of the second flow passages 132.

In the present embodiment, the first structural members 120*a* and 120*b* and the second structural members 130*a* and 130*b* are long slats each having a C-shaped cross section, and can be engaged with each other in a row so that the first flow passages 121, 122 and the second flow passages 131, 132 are formed between the members. However, in other embodiments, the first structural members 120*a*, 120*b* and the second structural members 130*a*, 130*b* may have an L-shaped, inverted T-shaped or Z-shaped cross-sectional shape.

With reference still to FIGS. 1-4, the number of second structural members 130*a* is equal to the number of first structural members 120*a*, and the number of second structural members 130*b* is less than the number of first structural members 120*b*. The cross-sectional area of the first flow passages 122 is, for example, smaller than the cross-sectional area of the second flow passages 132, and the cross-sectional area of the first flow passages 121 is equal to the cross-sectional area of the second flow passages 132. The number of the first flow passages 122 is greater than the number of second flow passages 132. As will be appreciated by those skilled in the art, the first and second heat dissipation structures 120 and 130 are designed primarily to increase the contact area between the fluid 13 and the housing 110.

In the instant embodiment, since the number of the first flow passages 122 is, for example, larger than the number of the second flow passages 132, the contact area of the first heat dissipation structure 120 with the fluid 13 may be larger than that of the second heat dissipation structure 130. As a result, the rate of vaporization of the fluid 13 flowing through the first heat dissipation structure 120 may be greater than the rate of vaporization of the fluid 13 flowing through the second heat dissipation structure 130. As such, dynamic pressure (e.g., a pressure difference) of the fluid will drive vaporized fluid 13 toward the second opening 113. As a result, the circulation effect of the fluid 13 in the circuit formed by the first pipe 11, the second pipe 12, and the chamber 111 can be remarkably increased.

The average cross-sectional area of the first flow passages 122 is smaller than the average cross-sectional area of the second flow passages 132 in the second evaporation zone 111*b* and, therefore, in the first flow passages 122 bubbles generated by the vaporized fluid 13 are relatively dense, and the volume of bubbles generated by the fluid 13 vaporized in the second flow path 132 is larger than in the first flow passages 122. As a result, there is a pressure difference between where the first flow passages 122 and the second flow passages 132 are located, through which the gaseous fluid 13 is driven, thereby increasing the flow rate of the fluid 13 (including the liquid state and the gaseous state) in the circuit formed by the first pipe 11, the second pipe 12, and the chamber 111.

Further, since the bubbles generated by the vaporized fluid 13 in the first flow passages 122 are relatively dense and the cross-sectional area of the second flow passages 132 is, for example, larger than the cross-sectional area of the first flow passages 122, the bubbles generated by the vaporized fluid 13 within the first flow passages 122 pass smoothly through the second flow passage 132 without being obstructed therein.

In the present embodiment, the first heat dissipation structure 120 has more first structural members 120*a* and 120*b* than the second structural members 130*a* and 130*b* provided in the second heat dissipation structure 130, so that the first flow passages 121, 122 have a smaller total cross sectional area than the total cross-sectional area of the second flow paths 131 and 132. As a result, the first heat dissipation structure 120 has a larger flow resistance than the second heat dissipation structure 130. When the fluid 13 in chamber 111 vaporizes, the fluid 13 tends to flows in the direction of the lower flow resistance, and this contributes to the flow of the fluid 13 in the direction of the second structural members 130*a*, 130*b* and the second opening 113.

In the present embodiment, the housing 110 further has a first positioning portion 115, a second positioning portion 116, and a third positioning portion 117, which each protrude into the chamber 111. The first positioning portion 115, the second positioning portion 116, and the third positioning portion 117 have, for example, a lateral rib shape and are configured to lay across the first evaporation zone 111*a* and the second evaporation zone 111*b* with respect to the flow direction of the fluid 13.

With particular reference now to FIGS. 2 and 3, the first positioning portion 115 is located between the second positioning portion 116 and the first opening 112, and the second positioning portion 116 is located between the first positioning portion 115 and the third positioning portion 117. The third positioning portion 117 is located between the second positioning portion 116 and the second opening 113. The first heat dissipation structure 120 is disposed between the first positioning portion 115 and the second positioning portion 116. By employing the first positioning portion 115 and the second positioning portion 116, it is possible to facilitate assemblage of the first heat dissipation structure 120 within the housing 110. The second heat dissipation structure 130 is disposed between the second positioning portion 116 and the third positioning portion 117. By employing the second positioning portion 116 and the third positioning portion 117, it is possible to facilitate assemblage of the second heat dissipation structure 130 within the housing 110.

In an alternative embodiment, the second positioning part 116, located between the first heat dissipation structure 120 and the second heat dissipation structure 130, can separate the two structures, thereby increasing the flow of the fluid 13 from the first flow paths 121 or 122 to the second flow paths 131 or 132 so that the bubbles generated by the fluid 13 vaporized in the first flow paths 121 and 122 may flow into the second flow paths 131 or 132 according to the shortest path.

In the present embodiment, as shown in FIGS. 1 and 2, a method of manufacturing the evaporator 100 includes the steps of first forming the housing 110, the cover 140, and the first and second structural members 120 and 130, respectively. The housing 110 is formed, for example, by forging, casting or cutting. The first structural members 120*a*, 120*b* and the second structural members 130*a*, 130*b* are fabricated, for example, by forging a plurality of first structural members 120*a*, 120*b* and second structural members 130*a*, 130*b*. Then, any two adjacent first structural members 120*a* are engaged with each other, and any two adjacent first structural members 120*b* are engaged with each other and one of the first structural members 120*a* is engaged with one of the first structural members 120*b* to constitute a first heat dissipation structure 120 having a plurality of first flow passages 121 and 122. Similarly, any two adjacent second structural members 130*a* are engaged with each other, and any two adjacent second structural members 130*b* are engaged with each other and one of the second structural members 130*a* is engaged with one of the second structural members 130*b* to constitute a second heat dissipation structure 130 having a plurality of second flow passages 131 and 132.

Next, the first heat dissipation structure 120 and the second heat dissipation structure 130 are assembled in the chamber 111, and the first heat dissipation structure 120 and the second heat dissipation structure 130 are fixed to the housing 110 by soldering. As shown, both the first and second heat dissipation structures 120 and 130 are disposed across the first evaporation zone 111*a* and the second evaporation zone 111*b*. Thereafter, the cover or lid 140 is provided on the housing 110, and the cover 140 covers the chamber 111 and the first and second heat dissipation structures 120 and 130 disposed in the chamber 111. Soldering with solder paste, between the first heat dissipation structure 120 and the housing 110, between the second heat dissipation structure 130 and the housing 110, and between the cover 140 and the housing 110 may be completed by a single heat welding operation after the assembly is completed. The manufacturing method of the evaporator 100 of the present embodiment can not only improve the quality of the product, but can also improve the producibility of the product by, for example, avoiding etching or machining with a computer numerical control tool, and therefore also reduce production costs.

In another embodiment, the first structural members 120*a*, 120*b* of the first dissipation structure 120 and the second structural members 130*a*, 130*b* of the second heat dissipation structure 130 may be directly assembled in the chamber 111 after the forging and molding processes, without the step of first engaging individual elements thereof with each other.

In sum, and as described above, the evaporator of the present invention is provided with a first heat dissipation structure and a second heat dissipation structure in a chamber of the housing, and the first heat dissipation structure and the second heat dissipation structure have a plurality of first flow passages and a plurality of second flow passages for passing a fluid. With this arrangement, the contact area between the fluid and the housing is increased to increase the vaporization rate of the fluid. More specifically, since the number of the first flow passages located in the second evaporation zone is larger than the number of the second flow passages located in the second evaporation zone, and the cross-sectional area of the first flow passages located in the second evaporation zone is smaller than that of the second flow passages there will be a pressure difference between the first flow passages located in the second evaporation zone and the second flow passages located in the second evaporation zone after the vaporization of the fluid, thereby smoothly driving the fluid in a gaseous state out of the chamber via the second opening in the chamber.

Moreover, the first heat dissipation structure and the second heat dissipation structure of the present invention can be produced by forging and engaging steps, etc., and then assembled into the housing, precluding the need for more expensive and time consuming cutting operations using etching or computer numerical control tools. The method for manufacturing the evaporator of the present invention can not only improve product yield and production efficiency, but can also reduce production costs.

The above description is intended by way of example only.

What is claimed is:

1. A method of manufacturing an evaporator, comprising:

forming a first heat dissipation structure having a plurality of first flow passages;

forming a second heat dissipation structure having a plurality of second flow passages;

forming a housing having a chamber, a first opening and a second opening;

disposing the first heat dissipation structure and the second heat dissipation structure in the chamber such that the chamber is configured to enable a flow of fluid between the first opening and the second opening via the first flow passages and the second flow passages, sequentially, wherein the chamber comprises a first evaporation zone and a second evaporation zone disposed between the first opening and the second opening, the first evaporation zone being separated from the second evaporation zone, and the first heat dissipation structure spans the first evaporation zone and the second evaporation zone on respective sides of the chamber, and arranging the housing to be in contact with, and over, a heat pipe such that the first evaporation zone overhangs the heat pipe, and at least the first flow passages in the second evaporation zone have a depth such that lower surfaces of at least the first flow passages in the second evaporation zone extend below a plane defined by respective contacting surfaces of the heat pipe and the housing.

2. The method of manufacturing an evaporator according to claim 1, wherein the first evaporation zone and the second evaporation zone are arranged on respective sides of the chamber, the first heat dissipation structure spanning the first evaporation zone and the second evaporation zone.

3. The method of manufacturing an evaporator according to claim 1, wherein a cross-sectional area of the first flow passages is smaller than a cross-sectional area of the second flow passages.

4. The method of manufacturing an evaporator according to claim 1, wherein the step of forming the first heat dissipation structure includes:

forging a metal to form a plurality of C-shaped structural members;

arranging the structural members side by side with each other so that a given one of the first flow passages is formed between any two adjacent C-shaped structural members.

5. The method of manufacturing an evaporator according to claim 1, further comprising:

providing a cover on the housing after the first heat dissipation structure is disposed in the chamber.

6. The method of manufacturing an evaporator according to claim 1, wherein the step of disposing the first heat dissipation structure in the chamber includes welding and bonding the first heat dissipation structure to the housing.

* * * * *